United States Patent
Peng et al.

(10) Patent No.: US 8,052,455 B1
(45) Date of Patent: Nov. 8, 2011

(54) MOUNTING APPARATUS FOR FLASH DRIVE

(75) Inventors: Wen-Tang Peng, Taipei Hsien (TW); Zhe Zhang, Shenzhen (CN); Xu-Fei Liang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/912,779

(22) Filed: Oct. 27, 2010

(30) Foreign Application Priority Data

Oct. 18, 2010 (CN) .......................... 2010 1 0510083

(51) Int. Cl.
*R01R 13/627* (2006.01)
(52) U.S. Cl. ....................................................... 439/353
(58) Field of Classification Search .................. 439/353, 439/680, 483
See application file for complete search history.

(56) References Cited

U.S. PATENT DOCUMENTS

| 4,820,179 A * | 4/1989 | Saijo ............................. 439/224 |
| 6,254,400 B1 * | 7/2001 | Yodogawa ....................... 439/78 |
| 2006/0252307 A1 * | 11/2006 | Koenig et al. ................. 439/557 |
| 2009/0258539 A1 * | 10/2009 | Zheng et al. ............. 439/607.41 |
| 2010/0041265 A1 * | 2/2010 | Wang ............................. 439/353 |

* cited by examiner

*Primary Examiner* — Tulsidas C Patel
*Assistant Examiner* — Phuongchi T Nguyen
(74) *Attorney, Agent, or Firm* — Altis Law Group, Inc.

(57) ABSTRACT

A mounting apparatus is used to fix a flash drive mounted on a circuit board with a connector. The mounting apparatus is mounted on the circuit board and receives the flash drive and connector therein. The mounting apparatus includes a first sidewall and a second sidewall opposite to each other. An elastic piece and a resilient portion extend toward each other respectively from the first and second sidewall, to resist against opposite sides of the flash drive in response to the flash drive engaging with the connector.

6 Claims, 3 Drawing Sheets

MOUNTING APPARATUS FOR FLASH DRIVE

BACKGROUND

1. Technical Field

The present disclosure relates to a mounting apparatus for flash drives.

2. Description of Related Art

In some computer, programs for driving some elements mounted on circuit boards of the computers are stored in flash drives, such as universal serial bus (USB) flash drives, which are detachable from the computers. However, these USB flash drives are generally engaged with connectors of the computers directly. As a result, the USB flash drives may easily disengage from the corresponding connectors after impact and vibration of the computers or the USB flash drives.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
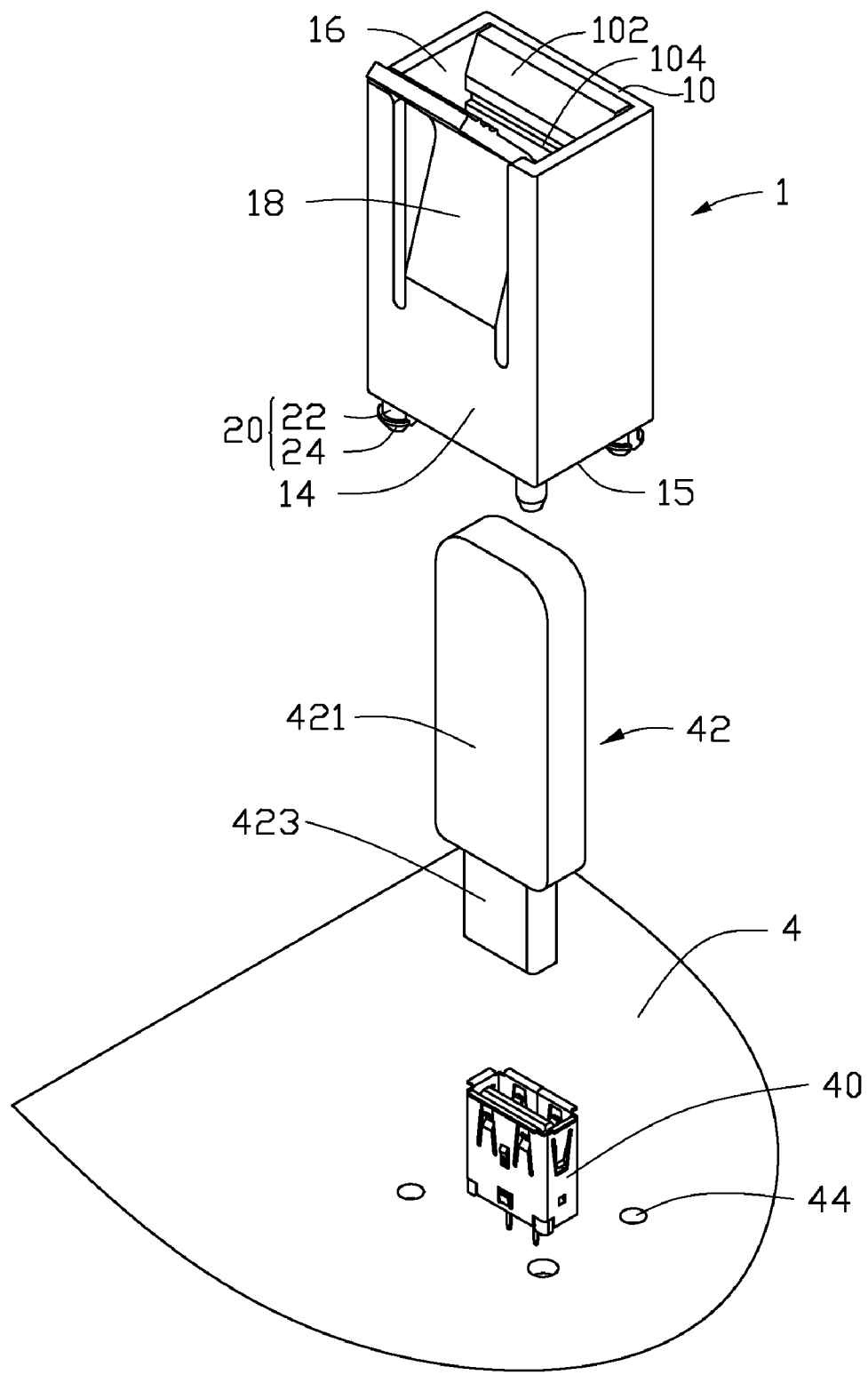
FIG. 1 is an exploded, isometric view of an exemplary embodiment of a mounting apparatus, together with a universal serial bus (USB) flash drive.
Figure 2:
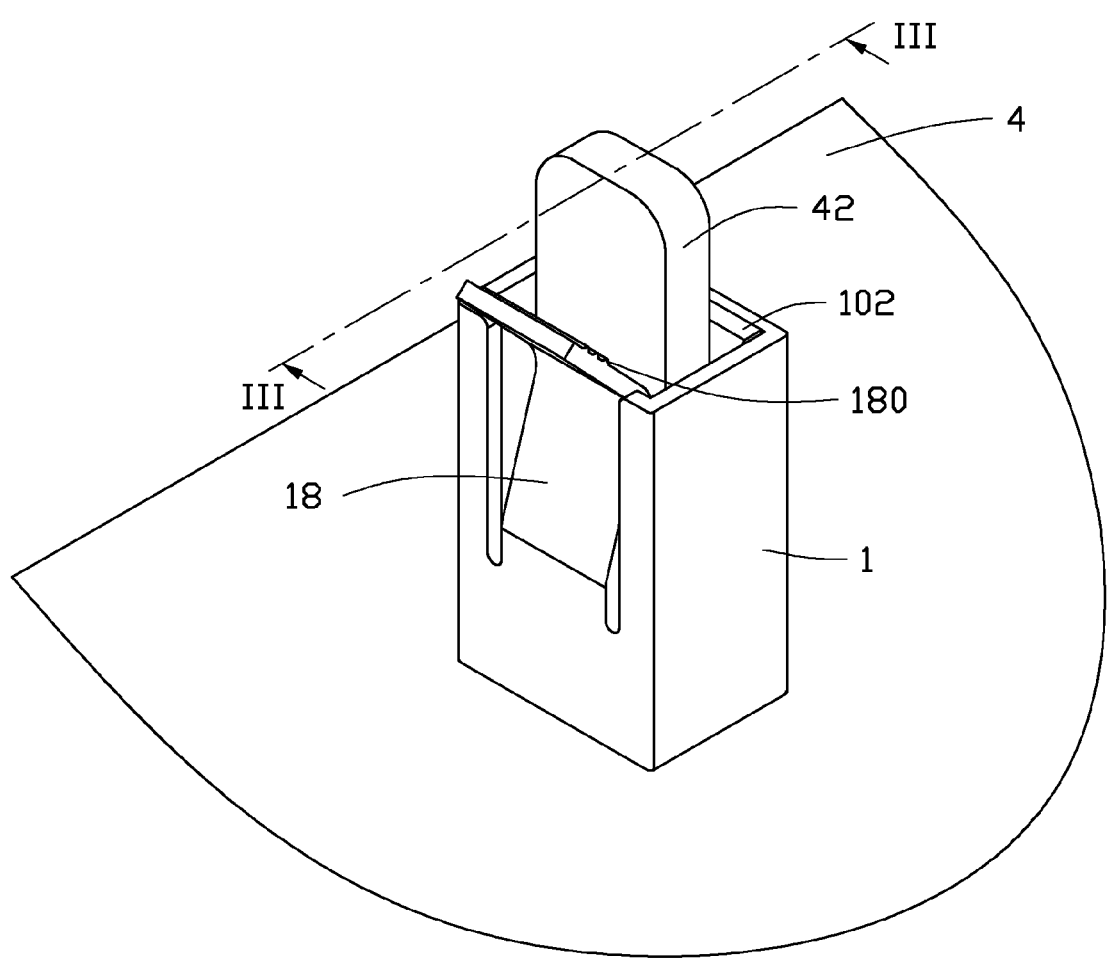
FIG. 2 is an assembled, isometric view of the mounting apparatus and the USB flash drive of FIG. 1.
Figure 3:
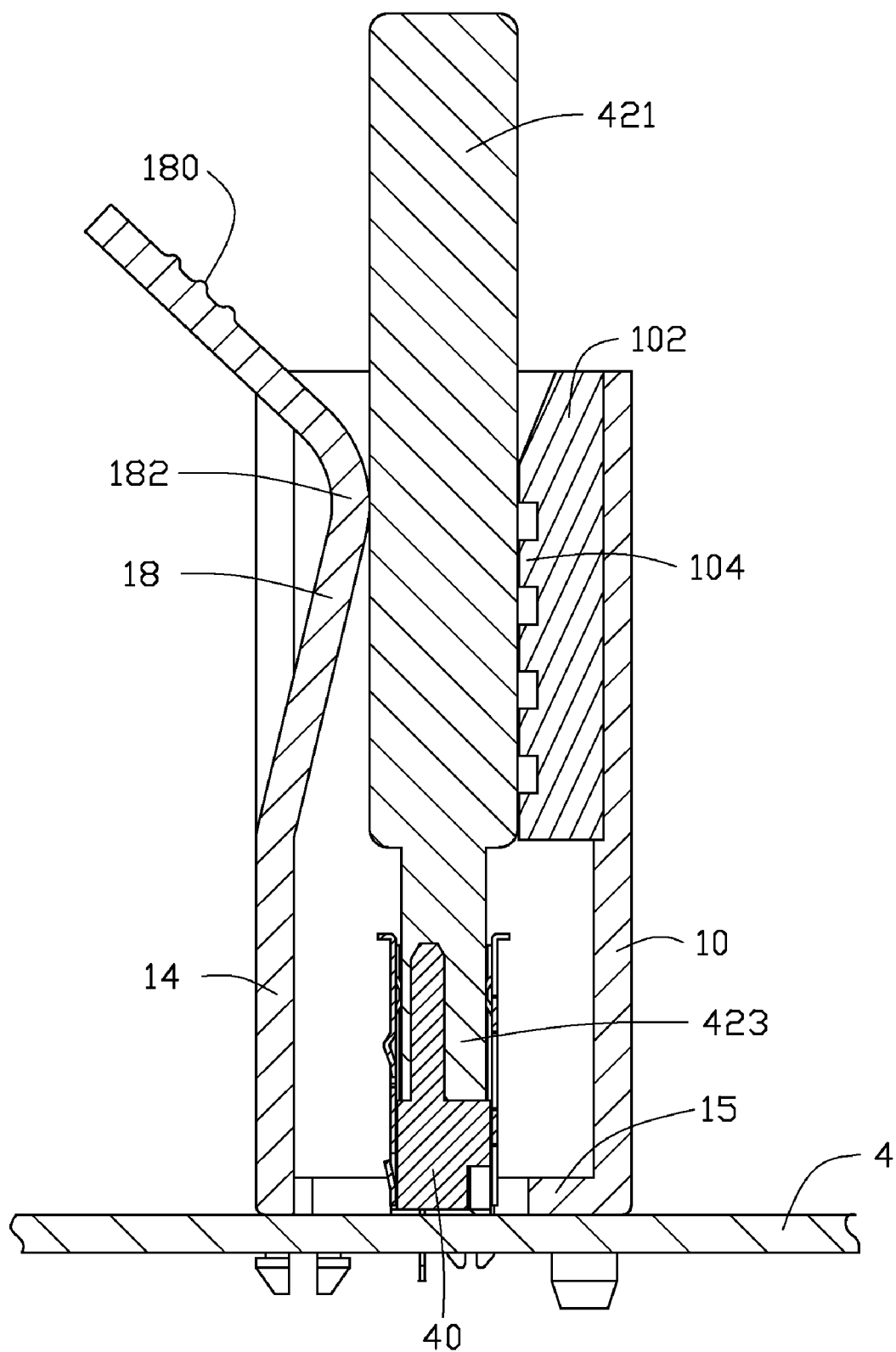
FIG. 3 is an assembled, sectional view taken along the line III-III of FIG. 2.

Referring to FIGS. 1 to 3, an exemplary embodiment of a mounting apparatus 1 is used to fix a flash drive, such as a universal serial bus (USB) flash drive 42, which includes a main body 421, and a plug 423 extending from an end of the main body 421 to be engaged with a connector 40 mounted on a circuit board 4.

The mounting apparatus 1 is hollow and substantially rectangular cube shaped, and defines a receiving space 16 therein. The mounting apparatus 1 includes a first sidewall 10, a second sidewall 14 opposite and substantially parallel to the first sidewall 10, and a bottom end 15 connected between bottoms of the first and second sidewalls 10 and 14. The receiving space 16 is bound by the first and second sidewalls 10 and 14, and extends through the bottom end 15. An elastic piece 102 made of rubber material slantingly extends from the inner surface of the first sidewall 10 toward the second sidewall 14. A first antiskid portion 104 is formed on the elastic piece 102, facing the second sidewall 14. A substantially C-shaped resilient member 18 extends from the second sidewall 14 and is concave towards the first sidewall 10. A contacting portion 182 is formed at a center of the resilient member 18, which is nearest to the elastic piece 102. A second antiskid portion 180 is formed on a distal end of the resilient member 18, opposing the elastic piece 102 for conveniently operating the resilient member 18. A fixing member 20 extends from each of four corners of the bottom end 15 of the mounting apparatus 1, each of which includes a post 22 extending from the bottom end 15 and a tapered latch 24 extending from a distal end of the post 22 opposite to the bottom of the mounting apparatus 1. Each of the latches 24 can be deformed.

The circuit board 4 defines four fixing holes 44 therein around the connector 40 corresponding to the fixing members 20 of the mounting apparatus 1.

In assembling of the mounting apparatus 1 to the circuit board 4, the latches 24 of the corresponding fixing members 20 of the mounting apparatus 1 are deformed to extend through the corresponding fixing holes 44 of the circuit board 4. Then blocked by the circuit board 4, to mount the mounting apparatus 1 to the circuit board 4, with the connector 40 is received in the receiving space 16 of the mounting apparatus 1 through the bottom end 15. In use, the USB flash drive 42 is inserted into the receiving space 16 through the top end of the mounting apparatus 1, the USB flash drive 42 drives the resilient member 18 and the elastic piece 102 to deform and to move away from each other. The plug 423 of the USB flash drive 42 is received in a socket defined in the connector 40, with the elastic piece 102 and the contacting portion 182 of the resilient member 18 resisting against opposite sides of the main body 421 of the USB flash drive 42 to fix the USB flash drive 42. In disassembling the USB flash drive 42, the first antiskid portion 104 and the second antiskid portion 180 are operated to deform the elastic piece 102 and the resilient member 18 to move away from each other, thereby the USB flash drive 42 can be readily removed from the connector 40.

As the elastic piece 102 and the resilient member 18 can be deformed, the mounting apparatus 1 may be used to fix other sizes of USB flash drives.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A mounting apparatus used to fix a flash drive to a connector of a circuit board, the flash drive comprising a main body, and a plug extending out from the main body, the plug being inserted into a socket defined in the connector while the main body seating on the socket, the mounting apparatus comprising:

a first sidewall;

a second sidewall opposite to the first sidewall, wherein a receiving space is bounded by the first and second sidewalls to receive the flash drive, the connector is received in the receiving space in response to the mounting apparatus being fixed to the circuit board;

an elastic piece slantingly extending from the first sidewall into the receiving space toward the second sidewall; and a resilient member extending from the second sidewall into the receiving space toward the elastic piece;

wherein the elastic piece and the resilient member elastically resist against opposite sides of the main body of the flash drive in response to the plug of the flash drive being received in the socket of the connector, and wherein the elastic piece is made of rubber.

2. The mounting apparatus of claim 1, wherein the resilient member is substantially C-shaped, with a center of the resilient member being nearest to the elastic piece to resist a corresponding side of the main body of the flash drive.

3. The mounting apparatus of claim 1, further comprising a bottom end connected between bottoms of the first and second sidewalls, wherein the receiving space extends through the bottom end, the connecter enters the receiving space through the bottom end, and a plurality of fixing members extends from the bottom end to be fixed to the circuit board.

4. The mounting apparatus of claim 3, wherein each of the fixing members comprises a post extending from the bottom end, and a tapered latch extending from a distal end of the post to extend through the circuit board and be blocked by the circuit board.

5. The mounting apparatus of claim 1, wherein a first antiskid portion is formed on a distal end of the resilient member facing the elastic piece, for conveniently operating the resilient member.

6. The mounting apparatus of claim 5, wherein a second antiskid portion is formed on the elastic piece facing the resilient member.

* * * * *